(12) United States Patent
Kim et al.

(10) Patent No.: US 12,100,780 B2
(45) Date of Patent: Sep. 24, 2024

(54) HIGHLY EFFICIENT MICRO LED IN LOW CURRENT RANGE, METHOD OF FABRICATING THE SAME, AND DISPLAY INCLUDING THE SAME

(71) Applicant: Korea Advanced Institute of Science and Technology, Daejeon (KR)

(72) Inventors: Sanghyeon Kim, Daejeon (KR); Juhyuk Park, Daejeon (KR); DaeMyeong Geum, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 265 days.

(21) Appl. No.: 17/182,015

(22) Filed: Feb. 22, 2021

(65) Prior Publication Data
US 2021/0280739 A1    Sep. 9, 2021

(30) Foreign Application Priority Data

Mar. 3, 2020    (KR) .......................... 10-2020-0026672
Jan. 4, 2021    (KR) .......................... 10-2020-0000512

(51) Int. Cl.
*H01L 27/15*    (2006.01)
*H01L 33/00*    (2010.01)
(Continued)

(52) U.S. Cl.
CPC ............ *H01L 33/04* (2013.01); *H01L 27/156* (2013.01); *H01L 33/0062* (2013.01); *H01L 33/30* (2013.01)

(58) Field of Classification Search
CPC ... H01L 33/04; H01L 27/156; H01L 33/0062; H01L 33/30; H01L 25/0753; H01L 33/06; H01L 33/002; H01L 33/486
See application file for complete search history.

(56) References Cited

U.S. PATENT DOCUMENTS

2011/0156616 A1*    6/2011    Anderson ............. H01L 27/156
                                              315/312
2011/0303893 A1*    12/2011   Wagner .................. H05B 33/10
                                              257/E33.008

(Continued)

FOREIGN PATENT DOCUMENTS

EP          0666624 A1    8/1995
JP       H11-340578 A    12/1999
(Continued)

*Primary Examiner* — Samuel Park
(74) *Attorney, Agent, or Firm* — BakerHostetler

(57) ABSTRACT

Various embodiments may provide a highly efficient micro light-emitting diode (LED) in a low current range, a method of fabricating the same, and a display including the same. The micro LED includes a first conductive type semiconductor layer and a second conductive type semiconductor layer and an active layer disposed between the first conductive type semiconductor layer and the second conductive type semiconductor layer and having a single quantum well structure. The single quantum well structure may be formed so that a ratio of a conduction band offset of any one of the first conductive type semiconductor layer or the second conductive type semiconductor layer and a valence band offset of the other of the first conductive type semiconductor layer or the second conductive type semiconductor layer becomes greater than 0 and less than 1.

19 Claims, 11 Drawing Sheets

(51) Int. Cl.
*H01L 33/04* (2010.01)
*H01L 33/30* (2010.01)

(56) References Cited

U.S. PATENT DOCUMENTS

| | | | | |
|---|---|---|---|---|
| 2013/0264588 A1* | 10/2013 | Liu | ...................... | H01L 25/075 438/27 |
| 2015/0325555 A1* | 11/2015 | Hashimoto | ............. | H01L 33/42 257/89 |
| 2019/0164945 A1* | 5/2019 | Chae | ...................... | H01L 33/62 |
| 2019/0198565 A1* | 6/2019 | Lee | ...................... | H01L 33/504 |

FOREIGN PATENT DOCUMENTS

| | | | | | |
|---|---|---|---|---|---|
| JP | 2004-134650 A | | 4/2004 | | |
| KR | 2006-0049617 A | | 5/2006 | | |
| KR | 2009-0051334 A | | 5/2009 | | |
| KR | 20140059512 A | * | 5/2014 | ............. | H01L 33/14 |
| KR | 20160046186 A | * | 10/2014 | | |

* cited by examiner

HIGHLY EFFICIENT MICRO LED IN LOW CURRENT RANGE, METHOD OF FABRICATING THE SAME, AND DISPLAY INCLUDING THE SAME

CROSS-REFERENCES TO RELATED APPLICATIONS

This application is based on and claims priority under 35 U.S.C. 119 to Korean Patent Application Nos. 10-2020-0026672 filed on Mar. 3, 2020 and 10-2021-0000512 filed on Jan. 4, 2021 in the Korean intellectual property office, the disclosures of which are herein incorporated by reference in their entireties.

TECHNICAL FIELD

Various embodiments relate to a highly efficient micro light-emitting diode (LED) in a low current range, a method of fabricating the same, and a display including the same.

BACKGROUND OF THE INVENTION

In general, a display functions to implement an image based on an electrical signal. To this end, the display includes a pixel array having a plurality of pixels, and outputs image light through each of the pixels. In this case, each of the pixels includes a color filter for displaying desired color light from white light or blue light. However, phosphors within each of the pixels may cause a light loss in each pixel. Accordingly, there is a difficulty in lowering power of each pixel and there is a problem in that efficiency of each pixel is degraded.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Various embodiments provide a highly efficient micro LED in a low current region, a method of fabricating the same, and a display including the same.

Various embodiments provide a micro LED for which lower power is implemented, a method of fabricating the same, and a display including the same.

According to various embodiments, a micro light-emitting diode (LED) includes a first conductive type semiconductor layer and a second conductive type semiconductor layer and an active layer disposed between the first conductive type semiconductor layer and the second conductive type semiconductor layer and having a single quantum well structure. The single quantum well structure may be formed so that a ratio of a conduction band offset of any one of the first conductive type semiconductor layer or the second conductive type semiconductor layer and a valence band offset of the other of the first conductive type semiconductor layer or the second conductive type semiconductor layer becomes greater than 0 and less than 1.

According to various embodiments, a method of fabricating a micro LED includes preparing a first conductive type semiconductor layer, stacking, on the first conductive type semiconductor layer, an active layer having a single quantum well structure, and stacking a second conductive type semiconductor layer on the active layer. The single quantum well structure may be formed so that a ratio of a conduction band offset of any one of the first conductive type semiconductor layer or the second conductive type semiconductor layer and a valence band offset of the other of the first conductive type semiconductor layer or the second conductive type semiconductor layer becomes greater than 0 and less than 1.

According to various embodiments, a display includes an integrated circuit device in which a driving circuit is wired and a plurality of micro light-emitting diodes (LEDs) mounted on one surface of the integrated circuit device. Each of the micro LEDs includes a first conductive type semiconductor layer and a second conductive type semiconductor layer and an active layer disposed between the first conductive type semiconductor layer and the second conductive type semiconductor layer and having a single quantum well structure. The single quantum well structure may be formed so that a ratio of a conduction band offset of any one of the first conductive type semiconductor layer or the second conductive type semiconductor layer and a valence band offset of another of the first conductive type semiconductor layer or the second conductive type semiconductor layer becomes greater than 0 and less than 1.

According to various embodiments, efficiency of the micro LED can be improved by forming the active layer of the micro LED as a single quantum well structure. In this case, since the ratio $\Delta E_C/\Delta E_V$ of the conduction band offset $\Delta E_C$ and the valence band offset $\Delta E_V$ in the single quantum well structure of the active layer is set to be greater than 0 and less than 1, efficiency of the micro LED in a low current region can be improved. Accordingly, a lower power of the micro LED can also be implemented.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

5B is a diagram for describing operating characteristics of the micro LED according to various embodiments.

6 is a diagram for describing operating characteristics of the micro LED according to various embodiments.

7A is a diagram for describing operating characteristics of the micro LED according to various embodiments.

7B is a diagram for describing operating characteristics of the micro LED according to various embodiments.

8 is a diagram for describing operating characteristics of the micro LED according to various embodiments.

9 is a diagram for describing operating characteristics of the micro LED according to various embodiments.

DETAILED DESCRIPTION

While illustrative embodiments have been illustrated and described, it will be appreciated that various changes can be made therein without departing from the spirit and scope of the invention.

Hereinafter, various embodiments of this document are described with reference to the accompanying drawings.

Figure 1:
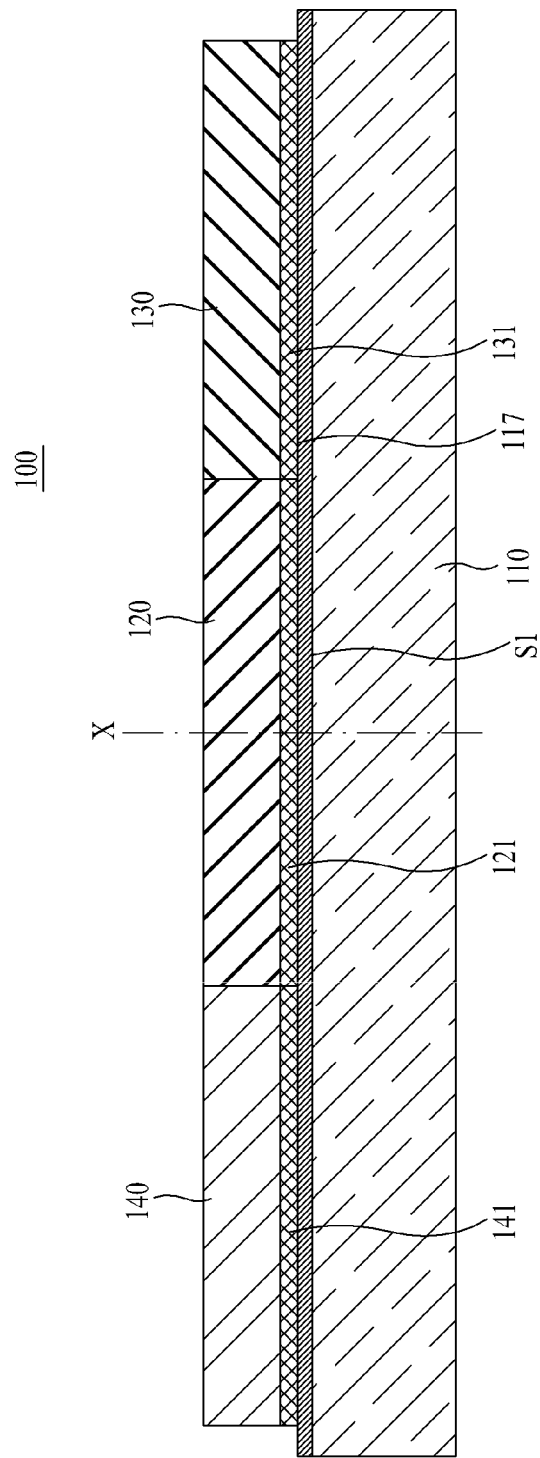
FIG. 1 is a diagram illustrating a display according to a first embodiment.

FIG. 1 is a diagram illustrating a display 100 according to a first embodiment.

Referring to FIG. 1, the display 100 according to a first embodiment may include an integrated circuit (IC) device 110 and a plurality of micro light-emitting diodes (LEDs) (hereinafter referred to as "micro LEDs") 120, 130, and 140.

The IC device 110 may support the micro LEDs 120, 130, and 140. Furthermore, the IC device 110 may provide a driving signal to the micro LEDs 120, 130, and 140. At this time, the IC device 110 may implement an image through the micro LEDs 120, 130, and 140 based on the driving signal. In this case, one axis X that penetrates one surface S1 of the IC device 110 may be defined. For example, the one surface S1 of the IC device 110 may be disposed on a plane perpendicular to the one axis X. The IC device 110 may include at least one of a driving circuit (not illustrated) or a protection layer 117. The driving circuit may be wired within the IC device 110. Furthermore, the driving circuit may be connected to the micro LEDs 120, 130, and 140 in the one surface S1 of the IC device 110. The protection layer 117 may protect the one surface S1 of the IC device 110. Although not illustrated, the protection layer 117 may expose some of the driving circuit in the one surface S1 of the IC device 110.

The micro LEDs 120, 130, and 140 may be mounted on the one surface S1 of the IC device 110. In this case, the micro LEDs 120, 130, and 140 may be attached to the one surface S1 of the IC device 110. Furthermore, the micro LEDs 120, 130, and 140 may output an image. At this time, each of the micro LEDs 120, 130, and 140 may generate light having a predetermined wavelength based on the driving signal of the IC device 110. Accordingly, an image may be implemented by a combination of lights generated from the micro LEDs 120, 130, and 140.

For example, the micro LEDs 120, 130, and 140 may include a plurality of first micro LEDs 120, a plurality of second micro LEDs 130, and a plurality of third micro LEDs 140. The first micro LEDs 120, the second micro LEDs 130, and the third micro LEDs 140 may be arranged in a predetermined pattern in the one surface S1 of the IC device 110. In this case, the first micro LEDs 120, the second micro LEDs 130, and the third micro LEDs 140 may be attached to the one surface S1 of the IC device 110. To this end, each of the first micro LEDs 120 includes a first adhesion layer 121, and may be attached to the one surface S1 of the IC device 110 through the first adhesion layer 121. Likewise, each of the second micro LEDs 130 includes a second adhesion layer 131, and may be attached to the one surface S1 of the IC device 110 through the second adhesion layer 131. Each of the third micro LEDs 140 includes a third adhesion layer 141, and may be attached to the one surface S1 of the IC device 110 through the third adhesion layer 141. The first micro LEDs 120 may generate light having a predetermined first wavelength. The second micro LEDs 130 may generate light having a predetermined second wavelength. The third micro LEDs 140 may generate light having a predetermined third wavelength. For example, the light having the first wavelength may be a red (R) light, the light having the second wavelength may be a green (G) light, and the light having the third wavelength may be a blue (B) light.

Figure 2:
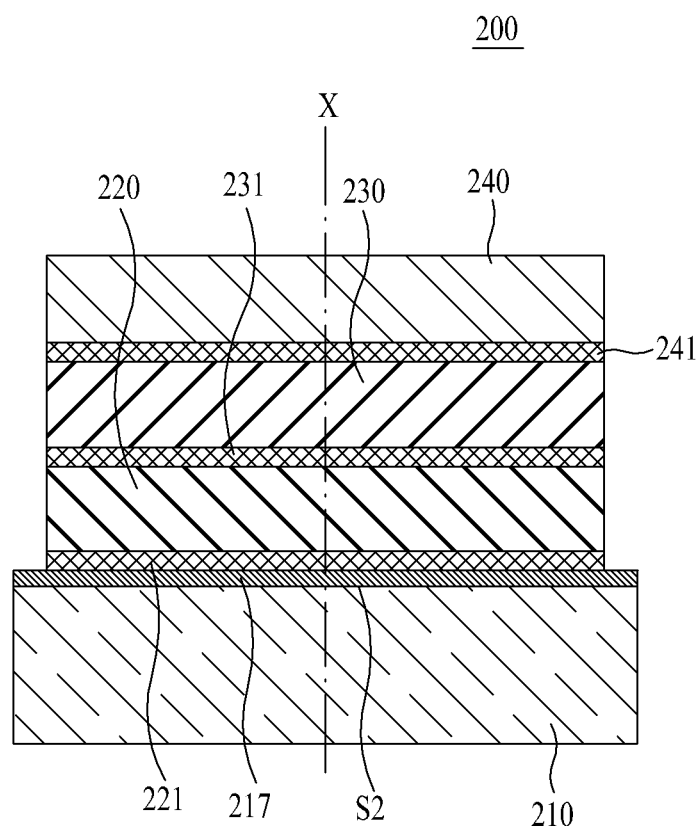
FIG. 2 is a diagram illustrating a display according to a second embodiment.

FIG. 2 is a diagram illustrating a display 200 according to a second embodiment.

Referring to FIG. 2, the display 200 according to a second embodiment may include an IC device 210 and a plurality of micro LEDs (hereinafter referred to as "micros LED") 220, 230, and 240.

The IC device 210 may support the micro LEDs 220, 230, and 240. Furthermore, the IC device 210 may provide a driving signal to the micro LEDs 220, 230, and 240. At this time, the IC device 210 may implement an image through the micro LEDs 220, 230, and 240 based on the driving signal. In this case, one axis X that penetrates one surface S2 of the IC device 210 may be defined. For example, the one surface S2 of the IC device 210 may be disposed on a plane perpendicular to the one axis X. The IC device 210 may include at least one of a driving circuit (not illustrated) or a protection layer 217. The driving circuit may be wired within the IC device 210. Furthermore, the driving circuit may be connected to the micro LEDs 220, 230, and 240 in the one surface S2 of the IC device 210. The protection layer 217 may protect the one surface S2 of the IC device 210. Although not illustrated, the protection layer 217 may expose some of the driving circuit in the one surface S2 of the IC device 210.

The micro LEDs 220, 230, and 240 may be mounted on the one surface S2 of the IC device 210. In this case, some micro LEDs 220, 230, and 240 may be stacked on the one surface S2 of the IC device 210. Furthermore, the micro LEDs 220, 230, and 240 may output an image. At this time, each of the micro LEDs 220, 230, and 240 may generate light having a predetermined wavelength based on the driving signal of the IC device 210. Accordingly, an image may be implemented by a combination of lights generated from the micro LEDs 220, 230, and 240.

For example, the micro LEDs 220, 230, and 240 may include a plurality of first micro LEDs 220, a plurality of second micro LEDs 230, and a plurality of third micro LEDs 240. The first micro LEDs 220 may be arranged in a predetermined pattern on the one surface S2 of the IC device 210. Furthermore, the second micro LEDs 230 may be stacked on the first micro LEDs 220, and the third micro LEDs 240 may be stacked on the second micro LEDs 230. To this end, each of the first micro LEDs 220 includes a first adhesion layer 221, and may be attached to the one surface S2 of the IC device 210 through the first adhesion layer 221. Each of the second micro LEDs 230 includes a second adhesion layer 231, and may be attached to the first micro LED 220 through the second adhesion layer 231. Each of the third micro LEDs 240 includes a third adhesion layer 241, and may be attached to the second micro LED 230 through the third adhesion layer 241. The first micro LEDs 220 may generate light having a predetermined first wavelength. The second micro LEDs 230 may generate light having a predetermined second wavelength. The third micro LEDs 240 may generate light having a predetermined third wavelength. For example, the light having the first wavelength may be a red (R) light. The light having the second wavelength may be a green (G) light. The light having the third wavelength may be a blue (B) light.

Figure 3:
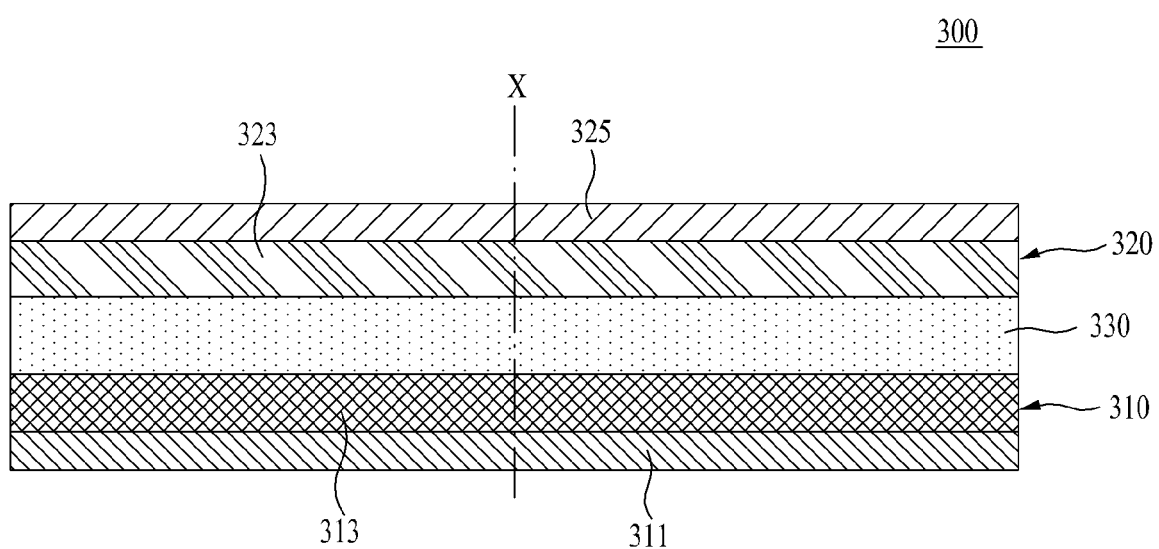
FIG. 3 is a diagram illustrating a micro LED according to various embodiments.
Figure 4:
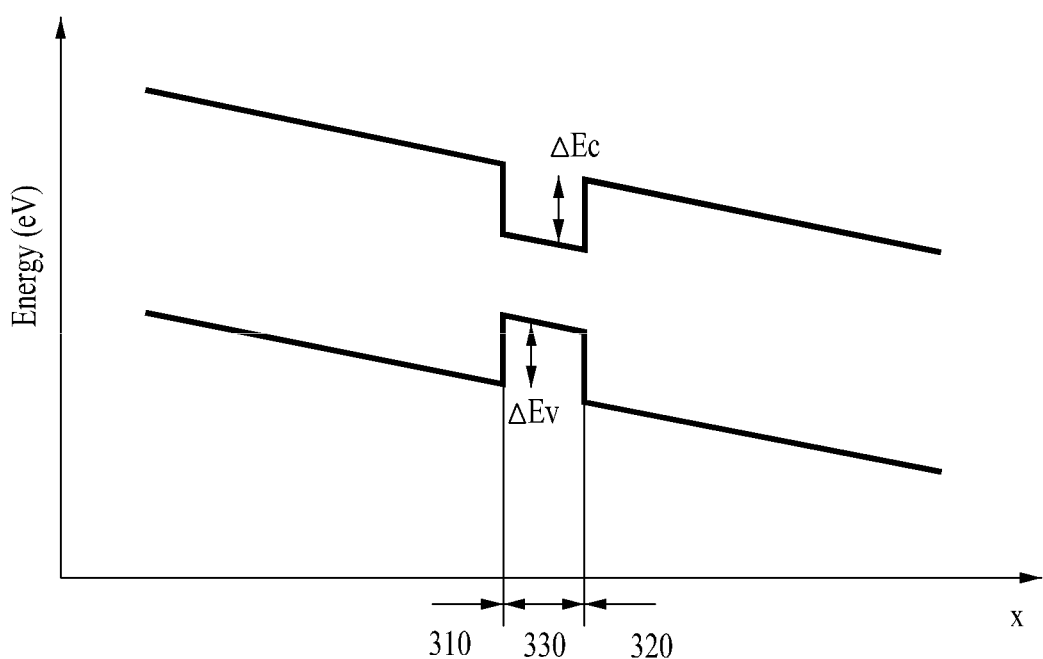
FIG. 4 is a diagram for describing a structure of an active layer of FIG. 3.

FIG. 3 is a diagram illustrating a micro LED 300 (e.g., the micro LEDs 120, 130, and 140 of FIG. 1 or the micro LEDs 220, 230, and 240 of FIG. 2) according to various embodiments. FIG. 4 is a diagram for describing a single quantum well (SQW) structure of an active layer 330 of FIG. 3. FIGS. 5A, 5B, 6, 7A, 7B, 8, and 9 are diagrams for describing operating characteristics of the micro LED 300 according to various embodiments.

Referring to FIG. 3, the micro LED (hereinafter referred to as a "micro LED") 300 according to various embodiments may include a first conductive type semiconductor layer 310, a second conductive type semiconductor layer 320, and the active layer 330.

The first conductive type semiconductor layer 310 and the second conductive type semiconductor layer 320 may be stacked with the active layer 330 interposed therebetween. In this case, the first conductive type semiconductor layer 310 may be disposed, and the second conductive type semiconductor layer 320 may be stacked on the first conductive type semiconductor layer 310 in one axis X. Furthermore, any one of the first conductive type semiconductor layer 310 or the second conductive type semiconductor layer 320 may be configured to inject holes into the active layer 330, and the other of the first conductive type semiconductor layer 310 or the second conductive type semiconductor layer 320 may be configured to inject electrons into the active layer 330.

For example, the first conductive type semiconductor layer 310 may include a first support layer 311 and a first barrier layer 313. In this case, the first support layer 311 is disposed. The first barrier layer 313 is stacked on the first support layer 311 in the one axis X, and may come into contact with the active layer 330. Furthermore, the second conductive type semiconductor layer 320 may include a second barrier layer 323 and a second support layer 325. In this case, the second barrier layer 323 is disposed on the active layer 330, and may come into contact with the active layer 330. The second support layer 325 may be stacked on the second barrier layer 323 in the one axis X.

According to one embodiment, the first conductive type semiconductor layer 310 may be a p type semiconductor layer, and the second conductive type semiconductor layer 320 may be an n type semiconductor layer. In such a case, the first conductive type semiconductor layer 310 may be configured to inject holes into the active layer 330, and the second conductive type semiconductor layer 320 may be configured to inject electrons into the active layer 330. For example, in the first conductive type semiconductor layer 310, the first support layer 311 may be composed of a gallium-phosphor compound (GaP), and the first barrier layer 313 may be composed of at least any one of an aluminum-gallium-indium-phosphor compound (AlGaInP) or an aluminum-indium-phosphor compound (AlInP). For example, in the second conductive type semiconductor layer 320, the second barrier layer 323 may be composed of at least any one of an aluminum-gallium-indium-phosphor compound (AlGaInP) or an aluminum-indium-phosphor compound (AlInP), and the second support layer 325 may be composed of a gallium-arsenic compound (GaAs).

According to another embodiment, the first conductive type semiconductor layer 310 may be an n type semiconductor layer, and the second conductive type semiconductor layer 320 may be a p type semiconductor layer. In such a case, the first conductive type semiconductor layer 310 may be configured to inject electrons into the active layer 330, and the second conductive type semiconductor layer 320 may be configured to inject holes into the active layer 330. For example, in the first conductive type semiconductor layer 310, the first support layer 311 may be composed of a gallium-arsenic compound (GaAs), and the first barrier layer 313 may be composed of at least any one of an aluminum-gallium-indium-phosphor compound (AlGaInP) or an aluminum-indium-phosphor compound (AlInP). For example, in the second conductive type semiconductor layer 320, the second barrier layer 323 may be composed of at least any one of an aluminum-gallium-indium-phosphor compound (AlGaInP) or an aluminum-indium-phosphor compound (AlInP), and the second support layer 325 may be composed of a gallium-phosphor compound (GaP).

The active layer 330 may be disposed between the first conductive type semiconductor layer 310 and the second conductive type semiconductor layer 320. In this case, the active layer 330 may be disposed between the first conductive type semiconductor layer 310 and the second conductive type semiconductor layer 320, on the first conductive type semiconductor layer 310. Furthermore, the active layer 330 may absorb holes and electrons from the first conductive type semiconductor layer 310 and the second conductive type semiconductor layer 320, respectively. At this time, the active layer 330 may generate light having a predetermined wavelength according to which the electrons and the holes injected from the first conductive type semiconductor layer 310 and the second conductive type semiconductor layer 320, respectively, are combined. For example, the active layer 330 may be composed of an indium-gallium-phosphor compound (InGaP).

According to various embodiments, the active layer 330 may have a single quantum well (SQW) structure as illustrated in FIG. 4. In this case, the first conductive type semiconductor layer 310 and the second conductive type semiconductor layer 320 may be composed of the same material, and thus the micro LED 300 may have a symmetrical structure. Alternatively, the first conductive type semiconductor layer 310 and the second conductive type semiconductor layer 320 may be composed of different materials, and thus the micro LED 300 may have an asymmetrical structure. In the SQW structure, a conduction band offset $\Delta E_C$ for absorbing electrons from any one of the first conductive type semiconductor layer 310 or the second conductive type semiconductor layer 320 may be defined. Furthermore, in the SQW structure, a valence band offset $\Delta E_V$ for absorbing holes from any one of the first conductive type semiconductor layer 310 or the second conductive type semiconductor layer 320 may be defined. In this case, the SQW structure of the active layer 330 may be formed so that the ratio $\Delta E_C/\Delta E_V$ of the conduction band offset $\Delta E_C$ and the valence band offset $\Delta E_V$ is greater than 0 and less than 1.

According to one embodiment, the first conductive type semiconductor layer 310 may be a p type semiconductor layer, and the second conductive type semiconductor layer 320 may be an n type semiconductor layer. In such a case, the first conductive type semiconductor layer 310 may be configured to inject holes into the active layer 330, and the second conductive type semiconductor layer 320 may be configured to inject electrons into the active layer 330. Furthermore, in the SQW structure of the active layer 330, a conduction band offset $\Delta E_C$ of the second conductive type semiconductor layer 320 and a valence band offset $\Delta E_V$ of the first conductive type semiconductor layer 310 may be defined. In this case, the SQW structure of the active layer 330 may be formed so that the ratio $\Delta E_C/\Delta E_V$ of the conduction band offset $\Delta E_C$ and the valence band offset $\Delta E_V$ becomes greater than 0 and less than 1.

According to another embodiment, the first conductive type semiconductor layer 310 may be an n type semiconductor layer, and the second conductive type semiconductor layer 320 may be a p type semiconductor layer. In such a case, the first conductive type semiconductor layer 310 may be configured to inject electrons into the active layer 330, and the second conductive type semiconductor layer 320 may be configured to inject holes into the active layer 330. Furthermore, in the SQW structure of the active layer 330, a conduction band offset $\Delta E_C$ of the first conductive type semiconductor layer 310 and a valence band offset $\Delta E_V$ of the second conductive type semiconductor layer 320 may be defined. In this case, the SQW structure of the active layer 330 may be formed so that the ratio $\Delta E_C/\Delta E_V$ of the conduction band offset $\Delta E_C$ and the valence band offset $\Delta E_V$ becomes greater than 0 and less than 1.

Figure 5A:
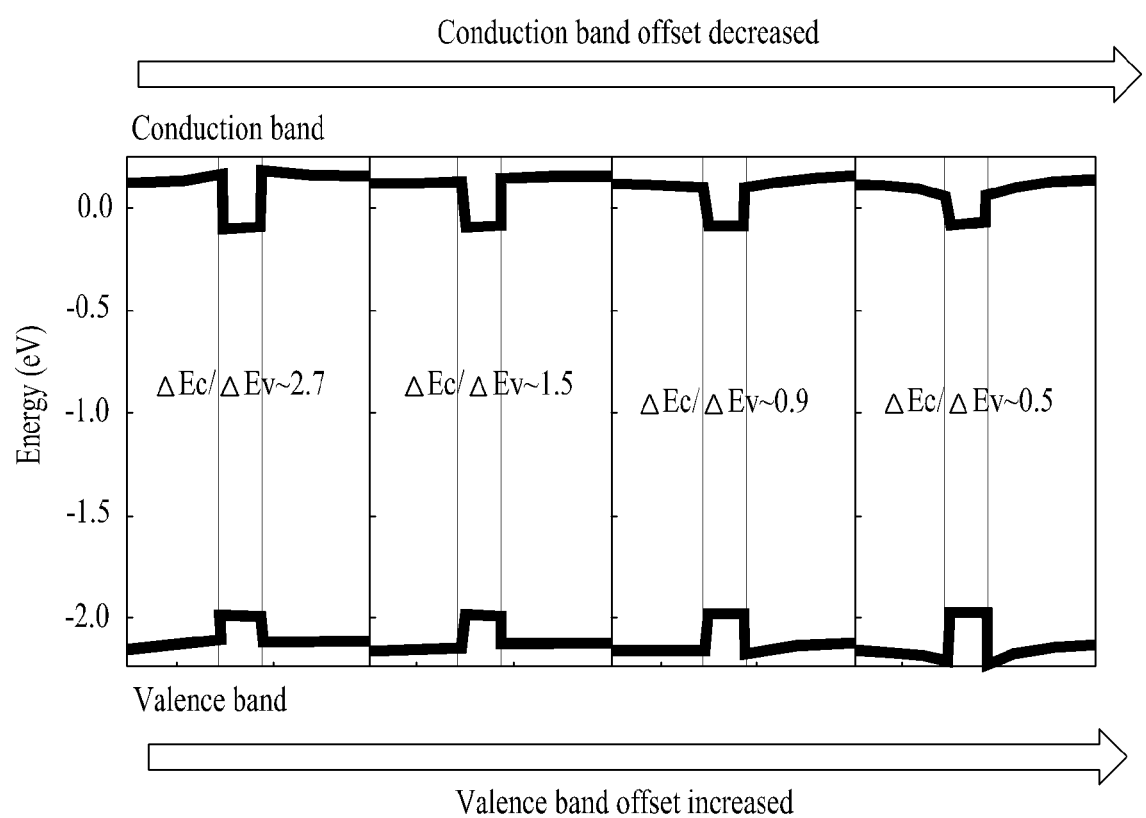
FIG. 5A is a diagram for describing operating characteristics of the micro LED according to various embodiments.
Figure 5B:
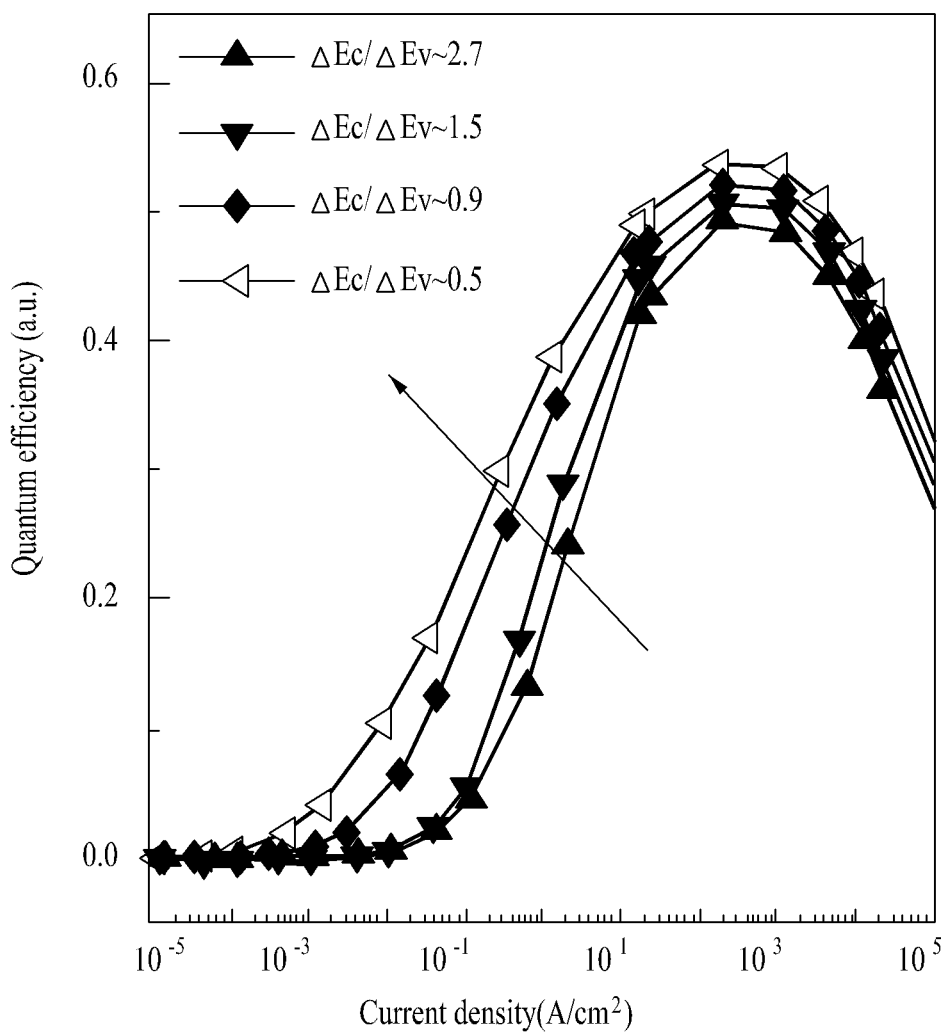

According to various embodiments, quantum efficiency (or internal quantum efficiency (IQE)) of the micro LED 300 can be improved. In order to check such improvement, as illustrated in FIG. 5A, the ratio $\Delta E_C/\Delta E_V$ of the conduction band offset $\Delta E_C$ and the valence band offset $\Delta E_V$ may be adjusted in implementing the SQW structure of the active layer 330. In this case, the first conductive type semiconductor layer 310 and the second conductive type semiconductor layer 320 may be composed of the same material, and thus the micro LED 300 may have a symmetrical structure. In this case, as illustrated in FIG. 5B, the lower the ratio $\Delta E_C/\Delta E_V$ of the conduction band offset $\Delta E_C$ and the valence band offset $\Delta E_V$, the better quantum efficiency of the micro LED 300 is. This may more significantly appear in a low current region. That is, since the SQW structure of the active layer 330 is formed so that the ratio $\Delta E_C/\Delta E_V$ of the conduction band offset $\Delta E_C$ and the valence band offset $\Delta E_V$ becomes greater than 0 and less than 1, quantum efficiency of the micro LED 300 can be significantly improved in a low current region.

Figure 6:
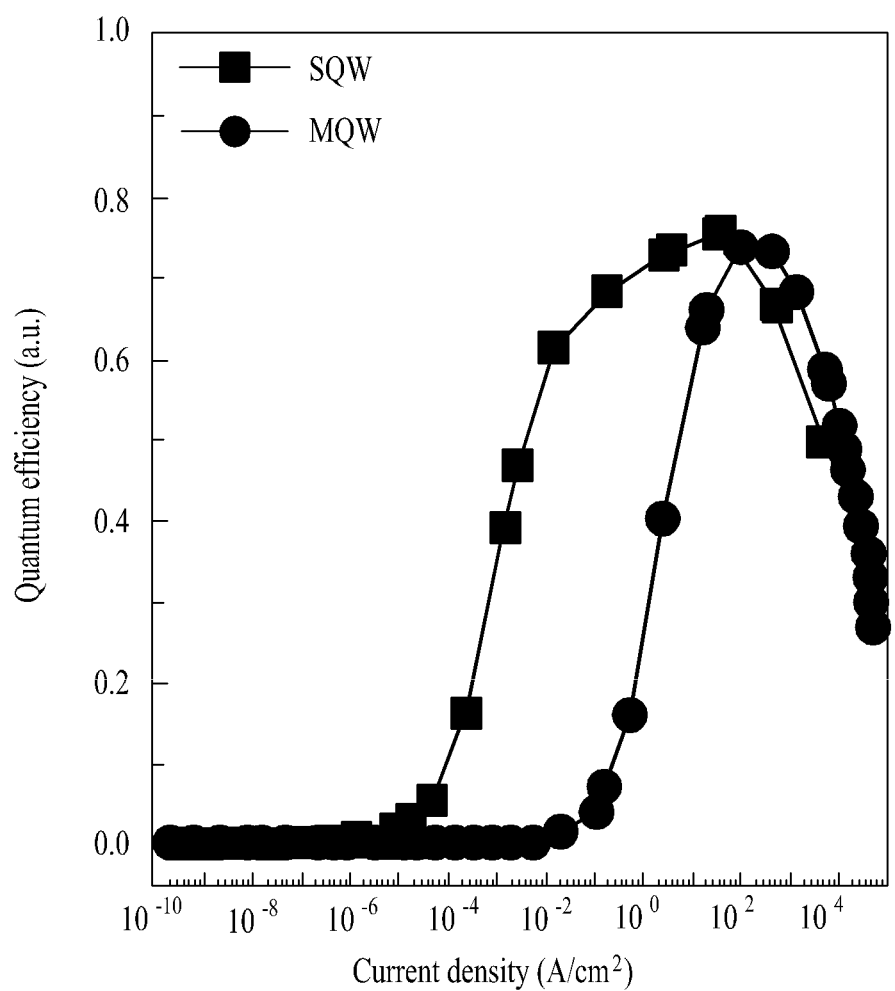

According to various embodiments, as illustrated in FIG. 6, quantum efficiency of the micro LED 300 in a low current region may be higher than quantum efficiency of the existing micro LED (not illustrated) in a low current region. In this case, each of the micro LED 300 and the existing micro LED may be implemented to have a symmetrical structure. The existing micro LED may include an active layer (not illustrated) having a multi-quantum well (MQW) structure. As illustrated in FIG. 6, the micro LED 300 can secure the same quantum efficiency in a current reduced by 2500 times, compared to the existing micro LED. That is, since the active layer 330 having the SQW structure is included, quantum efficiency of the micro LED 300 can be significantly improved in a low current region.

Figure 7A:
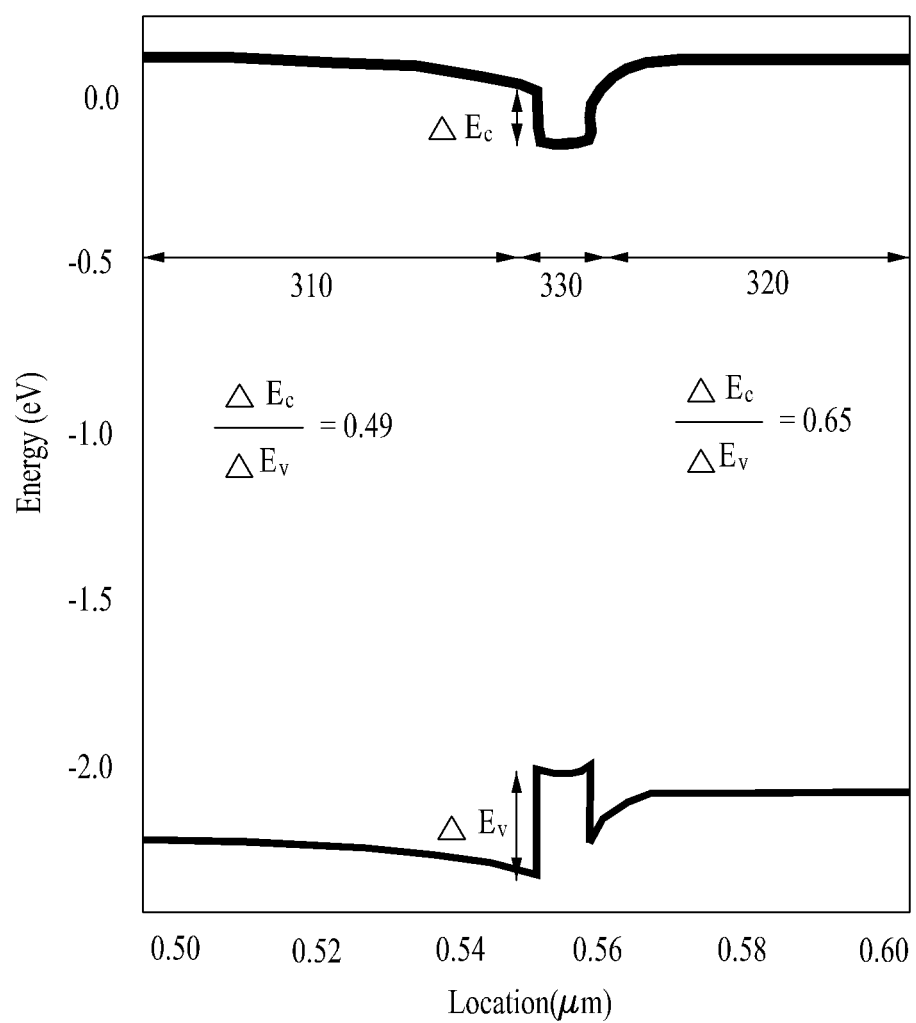
Figure 7B:
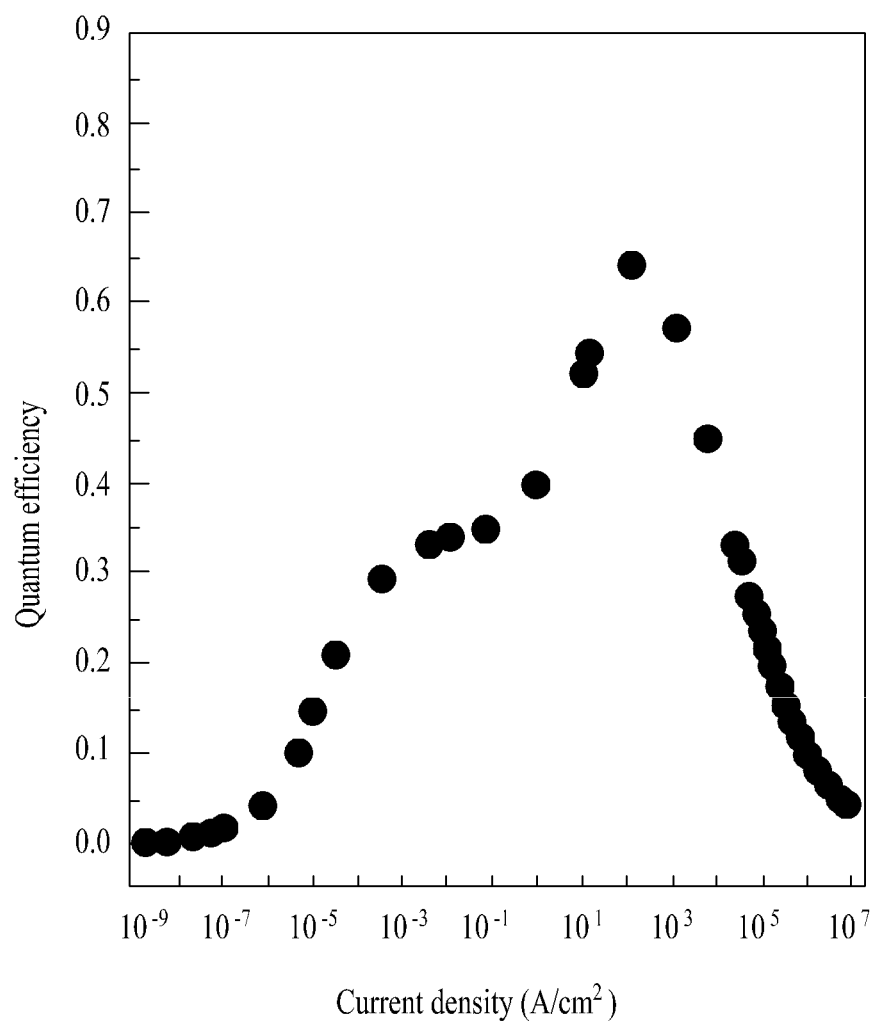

According to various embodiments, although the first conductive type semiconductor layer 310 and the second conductive type semiconductor layer 320 are composed of different materials, quantum efficiency of the micro LED 300 can be improved. In order to check such improvement, as illustrated in FIG. 7A, the first conductive type semiconductor layer 310 and the second conductive type semiconductor layer 320 may be composed of different materials, and the micro LED 300 may be implemented so that the ratio $\Delta E_C/\Delta E_V$ of the conduction band offset $\Delta E_C$ and the valence band offset $\Delta E_V$ becomes greater than 0 and less than 1 in the SQW structure of the active layer 330. Even in such a case, as illustrated in FIG. 7B, high quantum efficiency can be achieved with respect to the micro LED 300. In particular, quantum efficiency of the micro LED 300 can be significantly improved in a low current region.

Figure 8:
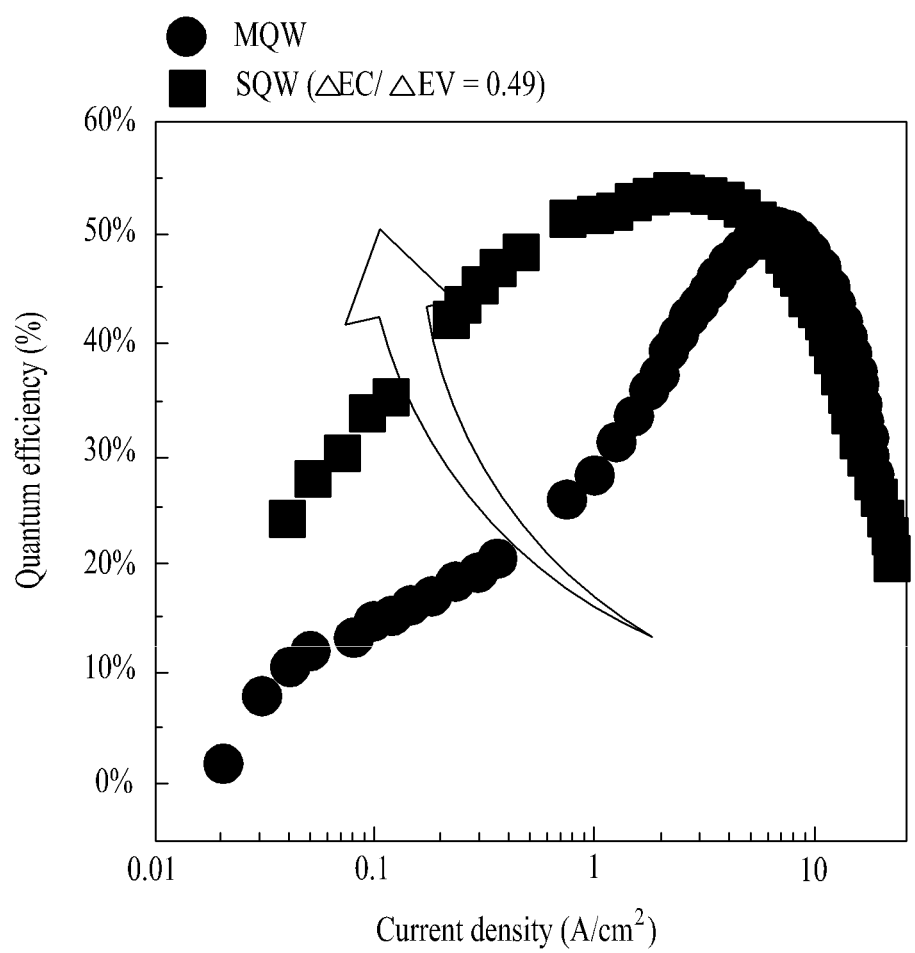

According to various embodiments, as illustrated in FIG. 8, quantum efficiency of the micro LED 300 in a low current region may be higher than quantum efficiency of the existing micro LED (not illustrated) in a low current region. In this case, each of the micro LED 300 and the existing micro LED may be implemented to have an asymmetrical structure. The existing micro LED may include an active layer (not illustrated) having an MQW structure. That is, since the active layer 330 having the SQW structure is included, quantum efficiency of the micro LED 300 can be significantly improved in a low current region.

Figure 9:
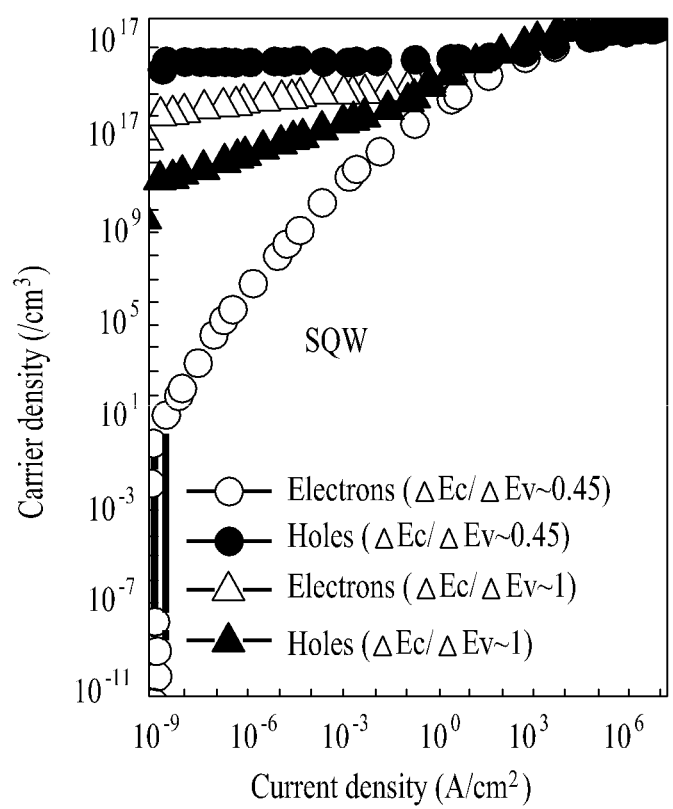

According to various embodiments, as illustrated in FIG. 9, an increase in the density of holes within the active layer 330 can be checked by analyzing a mechanism for quantum efficiency of the micro LED 300 through a carrier density distribution within the active layer 330 of the micro LED 300. That is, quantum efficiency of the micro LED 300 can be improved according to which the SQW structure of the active layer 330 causes an increase in the density of holes within the active layer 330.

The micro LED 300 according to various embodiments may be fabricated according to a semiconductor fabrication scheme.

First, the first conductive type semiconductor layer 310 may be prepared. For example, the first conductive type semiconductor layer 310 may include the first support layer 311 and the first barrier layer 313. In this case, the first support layer 311 may be disposed, and the first barrier layer 313 may be stacked on the first support layer 311 in the one axis X and come into contact with the active layer 330. According to one embodiment, the first conductive type semiconductor layer 310 may be a p type semiconductor layer. For example, in the first conductive type semiconductor layer 310, the first support layer 311 may be composed of a gallium-phosphor compound (GaP), and the first barrier layer 313 may be composed of at least any one of an aluminum-gallium-indium-phosphor compound (AlGaInP) or an aluminum-indium-phosphor compound (AlInP). According to another embodiment, the first conductive type semiconductor layer 310 may be an n type semiconductor layer. For example, in the first conductive type semiconductor layer 310, the first support layer 311 may be composed of a gallium-arsenic compound (GaAs), and the first barrier layer 313 may be composed of at least any one of an aluminum-gallium-indium-phosphor compound (AlGaInP) or an aluminum-indium-phosphor compound (AlInP).

Next, the active layer 330 may be stacked on the first conductive type semiconductor layer 310. For example, the active layer 330 may be composed of an indium-gallium-phosphor compound (InGaP).

Next, the second conductive type semiconductor layer 320 may be stacked on the active layer 330. The second conductive type semiconductor layer 320 may include the second barrier layer 323 and the second support layer 325. In this case, the second barrier layer 323 may be disposed on the active layer 330 and come into contact with the active layer 330, and the second support layer 325 may be stacked on the second barrier layer 323 in the one axis X. According to one embodiment, the second conductive type semiconductor layer 320 may be an n type semiconductor layer. For example, in the second conductive type semiconductor layer 320, the second barrier layer 323 may be composed of at least any one of an aluminum-gallium-indium-phosphor compound (AlGaInP) or an aluminum-indium-phosphor compound (AlInP), and the second support layer 325 may be composed of a gallium-arsenic compound (GaAs). According to another embodiment, the second conductive type semiconductor layer 320 may be a p type semiconductor layer. For example, in the second conductive type semiconductor layer 320, the second barrier layer 323 may be composed of at least any one of an aluminum-gallium-indium-phosphor compound (AlGaInP) or an aluminum-indium-phosphor compound (AlInP), and the second support layer 325 may be composed of a gallium-phosphor compound (GaP).

According to various embodiments, as illustrated in FIG. 4, the active layer 330 may have the SQW structure. In the SQW structure, the conduction band offset $\Delta E_C$ for absorbing electrons from any one of the first conductive type semiconductor layer 310 or the second conductive type semiconductor layer 320 may be defined. Furthermore, in the SQW structure, the valence band offset $\Delta E_V$ for absorbing holes from any one of the first conductive type semiconductor layer 310 or the second conductive type semiconductor layer 320 may be defined. In this case, the SQW structure of the active layer 330 may be formed so that the ratio $\Delta E_C/\Delta E_V$ of the conduction band offset $\Delta E_C$ and the valence band offset $\Delta E_V$ becomes greater than 0 and less than 1.

According to one embodiment, the first conductive type semiconductor layer 310 may be a p type semiconductor layer, and the second conductive type semiconductor layer 320 may be an n type semiconductor layer. In such a case, the first conductive type semiconductor layer 310 may be configured to inject holes into the active layer 330, and the second conductive type semiconductor layer 320 may be configured to inject electrons into the active layer 330. Furthermore, in the SQW structure of the active layer 330, a conduction band offset $\Delta E_C$ of the second conductive type semiconductor layer 320 and a valence band offset $\Delta E_V$ of the first conductive type semiconductor layer 310 may be defined. In this case, the SQW structure of the active layer 330 may be formed so that the ratio $\Delta E_C/\Delta E_V$ of the conduction band offset $\Delta E_C$ and the valence band offset $\Delta E_V$ becomes greater than 0 and less than 1.

According to another embodiment, the first conductive type semiconductor layer 310 may be an n type semiconductor layer, and the second conductive type semiconductor layer 320 may be a p type semiconductor layer. In such a case, the first conductive type semiconductor layer 310 may be configured to inject electrons into the active layer 330, and the second conductive type semiconductor layer 320 may be configured to inject holes into the active layer 330. Furthermore, in the SQW structure of the active layer 330, a conduction band offset $\Delta E_C$ of the first conductive type semiconductor layer 310 and a valence band offset $\Delta E_V$ of the second conductive type semiconductor layer 320 may be defined. In this case, the SQW structure of the active layer 330 may be formed so that the ratio $\Delta E_C/\Delta E_V$ of the conduction band offset $\Delta E_C$ and the valence band offset $\Delta E_V$ becomes greater than 0 and less than 1.

According to various embodiments, efficiency of the micro LED 120, 130, 140, 220, 230, 240, 300 can be improved by forming the active layer 330 of the micro LED 120, 130, 140, 220, 230, 240, 300 as the SQW structure. In this case, since the SQW structure of the active layer 330 is formed so that the ratio $\Delta E_C/\Delta E_V$ of the conduction band offset $\Delta E_C$ and the valence band offset $\Delta E_V$ becomes greater than 0 and less than 1, efficiency of the micro LED 120, 130, 140, 220, 230, 240, 300 in a low current region can be improved. Accordingly, lower power of the micro LED 120, 130, 140, 220, 230, 240, 300 can also be implemented.

The micro LED 120, 130, 140, 220, 230, 240, 300 according to various embodiments may include the first conductive type semiconductor layer 310, the second conductive type semiconductor layer 320, and the active layer 330 disposed between the first conductive type semiconductor layer 310 and the second conductive type semiconductor layer 320 and having the SQW structure.

According to various embodiments, the SQW structure may be formed so that the ratio $\Delta E_C/\Delta E_V$ of the conduction band offset $\Delta E_C$ of any one of the first conductive type semiconductor layer 310 or the second conductive type semiconductor layer 320 and the valence band offset $\Delta E_V$ of the other of the first conductive type semiconductor layer 310 or the second conductive type semiconductor layer 320 becomes greater than 0 and less than 1.

According to various embodiments, the active layer 330 may be disposed between the first conductive type semiconductor layer 310 and the second conductive type semiconductor layer 320, on the first conductive type semiconductor layer 310.

According to one embodiment, the first conductive type semiconductor layer 310 may inject holes into the active layer 330, and the second conductive type semiconductor layer 320 may inject electrons into the active layer 330.

According to one embodiment, the SQW structure may be formed so that the ratio $\Delta E_C/\Delta E_V$ of a conduction band offset $\Delta E_C$ of the second conductive type semiconductor layer 320 and a valence band offset $\Delta E_V$ of the first conductive type semiconductor layer 310 becomes greater than 0 and less than 1.

According to another embodiment, the first conductive type semiconductor layer 310 may inject electrons into the active layer 330, and the second conductive type semiconductor layer 320 may inject holes into the active layer 330.

According to another embodiment, the SQW structure may be formed so that the ratio $\Delta E_C/\Delta E_V$ of a conduction band offset $\Delta E_C$ of the first conductive type semiconductor layer 310 and a valence band offset $\Delta E_V$ of the second conductive type semiconductor layer 320 becomes greater than 0 and less than 1.

According to various embodiments, the active layer 330 may generate light having a predetermined wavelength by a combination of electrons and holes injected from the first conductive type semiconductor layer 310 and the second conductive type semiconductor layer 320, respectively.

According to various embodiments, the active layer 330 may be composed of an indium-gallium-phosphor compound (InGaP).

According to one embodiment, the micro LED 120, 130, 140, 220, 230, 240, 300 may have a symmetrical structure according to which the first conductive type semiconductor layer 310 and the second conductive type semiconductor layer 320 are composed of the same material.

According to another embodiment, the micro LED 120, 130, 140, 220, 230, 240, 300 may have an asymmetrical structure according to which the first conductive type semiconductor layer 310 and the second conductive type semiconductor layer 320 are composed of different materials.

A method of fabricating the micro LED 120, 130, 140, 220, 230, 240, 300 according to various embodiments may include the steps of preparing the first conductive type semiconductor layer 310, stacking, on the first conductive type semiconductor layer 310, the active layer 330 having the SQW structure, and stacking the second conductive type semiconductor layer 320 on the active layer 330.

According to various embodiments, the SQW structure may be formed so that the ratio $\Delta E_C/\Delta E_V$ of a conduction band offset $\Delta E_C$ of any one of the first conductive type semiconductor layer 310 or the second conductive type semiconductor layer 320 and a valence band offset $\Delta E_V$ of the other of the first conductive type semiconductor layer 310 or the second conductive type semiconductor layer 320 becomes greater than 0 and less than 1.

According to one embodiment, when the micro LED 120, 130, 140, 220, 230, 240, 300 operates, the first conductive type semiconductor layer 310 may inject holes into the active layer 330, and the second conductive type semiconductor layer 320 may inject electrons into the active layer 330.

According to one embodiment, the SQW structure may be formed so that the ratio $\Delta E_C/\Delta E_V$ of a conduction band offset $\Delta E_C$ of the second conductive type semiconductor layer 320 and a valence band offset $\Delta E_V$ of the first conductive type semiconductor layer 310 becomes greater than 0 and less than 1.

According to another embodiment, when the micro LED 120, 130, 140, 220, 230, 240, 300 operates, the first conductive type semiconductor layer 310 may inject electrons into the active layer 330, and the second conductive type semiconductor layer 320 may inject holes into the active layer 330.

According to another embodiment, the SQW structure may be formed so that the ratio $\Delta E_C/\Delta E_V$ of a conduction band offset $\Delta E_C$ of the first conductive type semiconductor layer 310 and a valence band offset $\Delta E_V$ of the second conductive type semiconductor layer 320 becomes greater than 0 and less than 1.

According to various embodiments, the active layer 330 may generate light having a predetermined wavelength by a combination of electrons and holes injected from the first conductive type semiconductor layer 310 and the second conductive type semiconductor layer 320, respectively.

According to various embodiments, the active layer 330 may be composed of an indium-gallium-phosphor compound (InGaP).

According to one embodiment, the micro LED 120, 130, 140, 220, 230, 240, 300 may have a symmetrical structure according to which the first conductive type semiconductor layer 310 and the second conductive type semiconductor layer 320 are composed of the same material.

According to another embodiment, the micro LED 120, 130, 140, 220, 230, 240, 300 may have an asymmetrical structure according to which the first conductive type semiconductor layer 310 and the second conductive type semiconductor layer 320 are composed of different materials.

The display 100, 200 according to various embodiments may include the IC device 110, 210 in which the driving circuit is wired, and the plurality of micro LEDs 120, 130, 140, 220, 230, 240, and 300 mounted on the one surface S1, S2 of the IC device 110, 210.

According to various embodiments, each of the micro LEDs 120, 130, 140, 220, 230, 240, and 300 may include the first conductive type semiconductor layer 310, the second conductive type semiconductor layer 320, and the active layer 330 disposed between the first conductive type semiconductor layer 310 and the second conductive type semiconductor layer 320 and having the SQW structure.

According to various embodiments, the SQW structure may be formed so that the ratio $\Delta E_C/\Delta E_V$ of a conduction band offset $\Delta E_C$ of any one of the first conductive type semiconductor layer 310 or the second conductive type semiconductor layer 320 and a valence band offset $\Delta E_V$ of the other of the first conductive type semiconductor layer 310 or the second conductive type semiconductor layer 320 becomes greater than 0 and less than 1.

According to various embodiments, the micro LEDs 120, 130, 140, 220, 230, 240, and 300 may generate lights having different wavelengths.

According to one embodiment, each of the micro LEDs 120, 130, 140, 220, 230, 240, and 300 may be attached to the one surface S1, S2 of the IC device 110, 210.

According to another embodiment, each of the micro LEDs 120, 130, 140, 220, 230, 240, and 300 may be stacked on the one surface S1, S2 of the IC device 110, 210.

Various embodiments of this document and the terms used in the embodiments are not intended to limit the technology described in this document to a specific embodiment, but should be construed as including various changes, equivalents and/or alternatives of a corresponding embodiment. Regarding the description of the drawings, similar reference numerals may be used in similar elements. An expression of the singular number may include an expression of the plural number unless clearly defined otherwise in the context. In this document, an expression, such as "A or B", "at least one of A or/and B", "A, B or C" or "at least one of A, B and/or C", may include all of possible combinations of listed items together. Expressions, such as "a first," "a second," "the first" and "the second", may modify corresponding elements regardless of the sequence and/or importance, and are used to only distinguish one element from the other element and do not limit corresponding elements. When it is described that one (e.g., first) element is "(operatively or communicatively) connected to" or "coupled with" the other (e.g., second) element, one element may be directly connected to the other element or may be connected to the other element through another element (e.g., third element).

According to various embodiments, each of elements (e.g., module or program) may include a single entity or a plurality of entities. According to various embodiments, one or more of the aforementioned elements or operations may be omitted or one or more other elements or operations may be added. Alternatively or additionally, a plurality of elements (e.g., modules or programs) may be integrated into a single element. In such a case, the integrated element may perform one or more functions of each of the plurality of elements identically with or similarly to a function performed by a corresponding element of the plurality of elements before they are integrated. According to various embodiments, operations performed by a module, a program or other elements may be executed sequentially, in parallel, repeatedly, or heuristically, or one or more of the operations may be executed in different order or may be omitted, or one or more operations may be added.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and the equivalents of the claims fall within the scope of the claims.

What is claimed:

1. A micro light-emitting diode (LED) comprising:
a first conductive type semiconductor layer and a second conductive type semiconductor layer; and
an active layer disposed between a first side of the first conductive type semiconductor layer and a first side of the second conductive type semiconductor layer and having a single quantum well structure,
wherein the single quantum well structure is formed in the active layer between the first conductive type semiconductor layer and the second conductive type semiconductor layer,
the first conductive type semiconductor layer consisting of a first support layer and a first barrier layer, the first barrier layer contacting with the active layer at the first side of the first conductive type semiconductor, and the first support layer being disposed on a side of the first barrier layer not contacting with the active layer to form a second side of the first conductive type semiconductor layer opposite to the first side of the first conductive type semiconductor layer, and the second conductive type semiconductor layer consisting of a second support layer and a second barrier layer, the second barrier layer contacting with the active layer at the first side of the second conductive type semiconductor, and the second support layer being disposed on a side of the second barrier layer not contacting with the active layer to form a second side of the second conductive type semiconductor layer opposite to the first side of the second conductive type semiconductor layer, so that a ratio of a conduction band offset of any one of the first conductive type semiconductor layer or the second conductive type semiconductor layer and a valence band offset of the other of the first conductive type semiconductor layer or the second conductive type semiconductor layer becomes greater than 0 and less than 1, and an asymmetrical structure according to which the first conductive type semiconductor layer and the second conductive type semiconductor layer are composed of different materials.

2. The micro LED of claim 1, wherein the active layer is disposed between the first conductive type semiconductor layer and the second conductive type semiconductor layer, on the first conductive type semiconductor layer.

3. The micro LED of claim 2, wherein:
the first conductive type semiconductor layer injects holes into the active layer, and the second conductive type semiconductor layer injects electrons into the active layer.

4. The micro LED of claim 3, wherein the single quantum well structure is formed so that a ratio of the conduction band offset of the second conductive type semiconductor layer and the valence band offset of the first conductive type semiconductor layer becomes greater than 0 and less than 1.

5. The micro LED of claim 2, wherein:
the first conductive type semiconductor layer injects electrons into the active layer, and
the second conductive type semiconductor layer injects holes into the active layer.

6. The micro LED of claim 5, wherein the single quantum well structure is formed so that a ratio of the conduction band offset of the first conductive type semiconductor layer and the valence band offset of the second conductive type semiconductor layer becomes greater than 0 and less than 1.

7. The micro LED of claim 1, wherein the active layer generates light having a predetermined wavelength by a combination of electrons and holes injected from the first conductive type semiconductor layer and the second conductive type semiconductor layer, respectively.

8. The micro LED of claim 1, wherein the active layer is composed of an indium-gallium-phosphor compound (InGaP).

9. The micro LED of claim 1, wherein one of the first support layer and the second support layer is composed of a gallium-arsenic (GaAs) compound and the other of the first support layer and the second support layer is composed of a gallium-phosphor (GaP) compound.

10. A method of fabricating a micro light-emitting diode (LED), comprising:
preparing a first conductive type semiconductor layer;

stacking, on the first conductive type semiconductor layer, an active layer having a single quantum well structure; and stacking a second conductive type semiconductor layer on the active layer, wherein the single quantum well structure is formed in the active layer between the first conductive type semiconductor layer and the second conductive type semiconductor layer, the first conductive type semiconductor layer consisting of a first support layer and a first barrier layer, the first barrier layer contacting with the active layer at the first side of the first conductive type semiconductor, and the first support layer being disposed on a side of the first barrier layer not contacting with the active layer to form a second side of the first conductive type semiconductor layer opposite to the first side of the first conductive type semiconductor layer, and the second conductive type semiconductor layer consisting of a second support layer and a second barrier layer, the second barrier layer contacting with the active layer at the first side of the second conductive type semiconductor, and the second support layer being disposed on a side of the second barrier layer not contacting with the active layer to form a second side of the second conductive type semiconductor layer opposite to the first side of the second conductive type semiconductor layer, so that a ratio of a conduction band offset of any one of the first conductive type semiconductor layer or the second conductive type semiconductor layer and a valence band offset of the other of the first conductive type semiconductor layer or the second conductive type semiconductor layer becomes greater than 0 and less than 1, and an asymmetrical structure according to which the first conductive type semiconductor layer and the second conductive type semiconductor layer are composed of different materials.

11. The method of claim 10, wherein:
when the micro LED operates, the first conductive type semiconductor layer injects holes into the active layer, and the second conductive type semiconductor layer injects electrons into the active layer, and the active layer generates light having a predetermined wavelength by a combination of electrons and holes injected from the first conductive type semiconductor layer and the second conductive type semiconductor layer, respectively.

12. The method of claim 11, wherein the single quantum well structure is formed so that a ratio of the conduction band offset of the second conductive type semiconductor layer and the valence band offset of the first conductive type semiconductor layer becomes greater than 0 and less than 1.

13. The method of claim 10, wherein when the micro LED operates, the first conductive type semiconductor layer injects electrons into the active layer, and the second conductive type semiconductor layer injects holes into the active layer.

14. The method of claim 13, wherein the single quantum well structure is formed so that a ratio of the conduction band offset of the first conductive type semiconductor layer and the valence band offset of the second conductive type semiconductor layer becomes greater than 0 and less than 1.

15. The method of claim 10, wherein the active layer is composed of an indium-gallium-phosphor compound (InGaP).

16. A display comprising:
an integrated circuit device in which a driving circuit is wired; and
a plurality of micro light-emitting diodes (LEDs) mounted on one surface of the integrated circuit device,
wherein each of the micro LEDs comprises:
   a first conductive type semiconductor layer and a second conductive type semiconductor layer; and
   an active layer disposed between the first conductive type semiconductor layer and the second conductive type semiconductor layer and having a single quantum well structure,
   wherein the single quantum well structure is formed in the active layer between the first conductive type semiconductor layer and the second conductive type semiconductor layer,
   the first conductive type semiconductor layer consisting of a first support layer and a first barrier layer, the first barrier layer contacting with the active layer at the first side of the first conductive type semiconductor, and the first support layer being disposed on a side of the first barrier layer not contacting with the active layer to form a second side of the first conductive type semiconductor layer opposite to the first side of the first conductive type semiconductor layer, and
   the second conductive type semiconductor layer consisting of a second support layer and a second barrier layer, the second barrier layer contacting with the active layer at the first side of the second conductive type semiconductor, and the second support layer being disposed on a side of the second barrier layer not contacting with the active layer to form a second side of the second conductive type semiconductor layer opposite to the first side of the second conductive type semiconductor layer,
   so that a ratio of a conduction band offset of any one of the first conductive type semiconductor layer or the second conductive type semiconductor layer and a valence band offset of another of the first conductive type semiconductor layer or the second conductive type semiconductor layer becomes greater than 0 and less than 1, and
   an asymmetrical structure according to which the first conductive type semiconductor layer and the second conductive type semiconductor layer are composed of different materials.

17. The display of claim 16, wherein the micro LEDs generate lights having different wavelengths.

18. The display of claim 17, wherein the micro LEDs are attached to the one surface of the integrated circuit device.

19. The display of claim 17, wherein the micro LEDs are stacked on the one surface of the integrated circuit device.

* * * * *